(12) United States Patent
Childs et al.

(10) Patent No.: US 7,358,529 B2
(45) Date of Patent: *Apr. 15, 2008

(54) ACTIVE MATRIX DISPLAY DEVICES, AND THEIR MANUFACTURE

(75) Inventors: Mark Jonathan Childs, Sutton (GB); David Andrew Fish, Haywards Heath (GB); Jason Roderick Hector, Redhill (GB); Nigel David Young, Redhill (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 226 days.

This patent is subject to a terminal disclaimer.

(21) Appl. No.: 10/507,770

(22) PCT Filed: Feb. 21, 2003

(86) PCT No.: PCT/IB03/00699

§ 371 (c)(1),
(2), (4) Date: Sep. 15, 2004

(87) PCT Pub. No.: WO03/079441

PCT Pub. Date: Sep. 25, 2003

(65) Prior Publication Data

US 2005/0255616 A1  Nov. 17, 2005

(30) Foreign Application Priority Data

Mar. 20, 2002 (GB) ............... 0206551.4
Apr. 26, 2002 (GB) ............... 0209560.2
Jul. 11, 2002 (GB) ............... 0216057.0

(51) Int. Cl.
*H01L 29/04* (2006.01)
(52) U.S. Cl. ............. 257/59; 257/72; 257/E25.005; 257/E27.133

(58) Field of Classification Search ............ 438/59, 438/72, 34; 257/59, 72, 88, E25.005, E27.133; 313/34
See application file for complete search history.

(56) References Cited

U.S. PATENT DOCUMENTS

| 6,781,152 B2* | 8/2004 | Yamazaki ............. 257/59 |
| 2005/0122288 A1* | 6/2005 | Fish et al. ............. 345/76 |
| 2005/0127376 A1* | 6/2005 | Young et al. ............. 257/80 |

(Continued)

FOREIGN PATENT DOCUMENTS

EP  0895219 A1  2/1999

(Continued)

*Primary Examiner*—Quoc Hoang
(74) *Attorney, Agent, or Firm*—Paul Im

(57) ABSTRACT

Physical barriers (210) are present between neighboring pixels (200) on a circuit substrate (100) of an active-matrix display device, such as an electroluminescent display formed with LEDs (25) of organic semiconductor materials. The invention forms at least parts of the barriers (210) with metal or other electrically-conductive material (240) that is insulated (40) from the LEDs but connected to the circuitry (4, 5, 6, 9, 140, 150, 160, T1, T2, Tm, Tg, Ch etc.) within the substrate (100). This conductive barrier material (240) may back up or replace, for example, matrix addressing lines (150) and/or form an additional component either within the pixel array or outside. The additional component comprising the conductive barrier material (240) is advantageously a capacitor (Ch), or an inductor (L) or transformer (W), or even an aerial.

13 Claims, 11 Drawing Sheets

| U.S. PATENT DOCUMENTS | | | | EP | 1102317 A2 | 5/2001 |
|---|---|---|---|---|---|---|
| 2005/0146279 A1* | 7/2005 | Hector et al. | 315/169.3 | GB | 2347017 A | 8/2000 |
| | | | | WO | WO 9943031 | 8/1999 |
| FOREIGN PATENT DOCUMENTS | | | | | | |
| EP | 1096568 A2 | 5/2001 | | * cited by examiner | | |

ACTIVE MATRIX DISPLAY DEVICES, AND THEIR MANUFACTURE

This invention relates to active-matrix display devices, particularly but not exclusively electroluminescent displays using light-emitting diodes of semiconducting conjugated polymer or other organic semiconductor materials. The invention also relates to methods of manufacturing such devices.

Such active-matrix electroluminescent display devices are known, comprising an array of pixels present on a circuit substrate, wherein each pixel comprises an electroluminescent element, typically of organic semiconductor material. The electroluminescent elements are connected to circuitry in the substrate, for example drive circuitry that includes supply lines and matrix addressing circuitry that includes addressing (row) and signal (column) lines. These lines are generally formed by thin-film conductor layers in the substrate. The circuit substrate also includes addressing and drive elements (typically thin-film transistors, hereafter termed "TFT"s) for each pixel.

In many such arrays, physical barriers of insulating material are present between neighbouring pixels in at least one direction of the array. Examples of such barriers are given in published United Kingdom patent application GB-A-2 347 017, published PCT patent application WO-A1-99/43031, published European patent applications EP-A-0 895 219, EP-A-1 096 568, and EP-A-1 102 317, the whole contents of which are hereby incorporated herein as reference material.

Such barriers are sometimes termed "walls", "partitions", "banks", "ribs", "separators", or "dams", for example. As can be seen from the cited references, they may serve several functions. They may be used in manufacture to define electroluminescent layers and/or electrode layers of the individual pixels and/or of columns of pixels. Thus, for example, the barriers prevent pixel overflow of conjugate polymer materials that may be ink-jet printed for red, green and blue pixels of a colour display or spin-coated for a monochrome display. The barriers in the manufactured device can provide a well-defined optical separation of pixels. They may also carry or comprise conductive material (such as upper electrode material of the electroluminescent element), as auxiliary wiring for reducing the resistance of (and hence the voltage drops across) the common upper electrode of the electroluminescent elements.

Active-matrix liquid-crystal displays (AMLCDs) similarly comprise a circuit substrate on which an array of pixels is present. In the AMLCD case, upstanding spacers (pillars, for example) are present on the circuit substrate between at least some of the neighbouring pixels. These spacers support the overlying opposite plate of the display over the active-matrix circuit substrate to define the cell spacing in which the liquid crystal material is accommodated. For the purpose of the present invention when applied to AMLCDs, the spacers/pillars between pixels of an AMLCD will be compared with the barriers between pixels of an active-matrix electroluminescent display (AMELD) and will be termed "barriers".

It is an aim of the present invention to exploit, develop, adapt and/or extend particular features of active-matrix display devices, so as to permit improvement and/or enhancement of the performance and/or capabilities of the device in a manner that is compatible with the basic device structure, its layout and its electronics.

According to one aspect of the present invention, there is provided an active-matrix display device (for example an AMELD or an AMLCD) having the features set out in Claim 1.

In accordance with the invention, the physical barriers between pixels are used to provide connections into and/or out of the circuit substrate, and may provide additional components of the device.

Thus, these pixel barriers are partly (possibly even predominantly) of electrically-conductive material, typically metal. This conductive barrier material is connected with a circuit element within the circuit substrate, while also being insulated at least at the sides of the barriers adjacent to the pixel display elements. The said circuit element in the circuit substrate may take a variety of forms, depending on the particular improvement or enhancement or adaptation being made. Typically, it may be one or more thin-film elements of the group comprising: a conductor layer; an electrode connection; a supply line; an addressing line; a signal line; a thin-film transistor; a thin-film capacitor.

Much versatility is possible in accordance with the invention. Various structural features can be adopted for the pixel barriers. Thus, the conductive barrier material may extend as, for example, a line across the array, or it may be localised to, for example, individual pixels or groups of pixels or to other device areas.

Where the conductive barrier material is used to form an additional component, that component may be formed inside or outside the pixel array. As compared with connecting an external component, the integration of this additional component with pixel barrier technology can be used to enhance device performance at reduced cost and in compact areas within the display device.

At least some lengths of the conductive barrier material may simply serve as a back-up or even as a replacement for at least part of a thin-film conductor line of the circuit substrate, for example an address (row) line, a signal (column) line or a supply line. Thus, the conductive barrier material may provide (or at least back up) the addressing lines (row conductors) over most of their length to reduce voltage drops along the addressing lines. In a case such as this, the barriers may be predominantly of conductive material (typically metal), or they may be predominantly of insulating material with a conductive coating.

Barrier structures used in accordance with the invention may be constructed with a metal core. This metal core can be used in various ways.

The metal core may itself provide the conductive barrier material that is connected with the circuit element in the substrate. It may have an insulating coating on at least its sides.

A metal coating can be provided on an insulating coating on the metal core. This metal coating may be connected to another circuit element. In one particularly useful form, the metal core, insulating coating and metal coating may together form a capacitor, for example an individual holding capacitor for each respective pixel. Thus, the pixel barriers may comprise separately insulated lengths, one or more of which may provide a capacitor having this metal-insulator coated barrier structure.

However, the metal core does not need to be connected to a circuit element in the substrate. Thus, for example, when the barrier comprises a metal coating on an insulating coating on a metal core of the barrier, the metal coating may provide the conductive barrier material that is connected with the circuit element in the substrate. The metal core may be, for example, a ferromagnetic core of an inductor or transformer that is integrated in this manner into the display device.

Thus, the barriers may comprise separately insulated portions, one or more of which provide a capacitor, an inductor or a transformer having these coated barrier structures. This separate capacitor or inductor or transformer length may be located within the pixel array, or it may be located outside the pixel array but still formed on the circuit substrate in the same process steps as the pixel barriers.

Other separately insulated conductive portions of the barriers may serve different functions. They may be used, for example, to back-up or to replace conductor lines of the circuit substrate and/or to form interconnections.

Instead of using a metal core, a metal coating of the barrier may be used to provide the conductive barrier material that is connected with the circuit element in the substrate.

According to another aspect of the present invention, there are also provided advantageous methods of manufacturing such an active-matrix display device.

Various advantageous features and feature-combinations in accordance with the present invention are set out in the appended Claims. These and others are illustrated in embodiments of the invention that are now described, by way of example, with reference to the accompanying diagrammatic drawings, in which:

Figure 2:
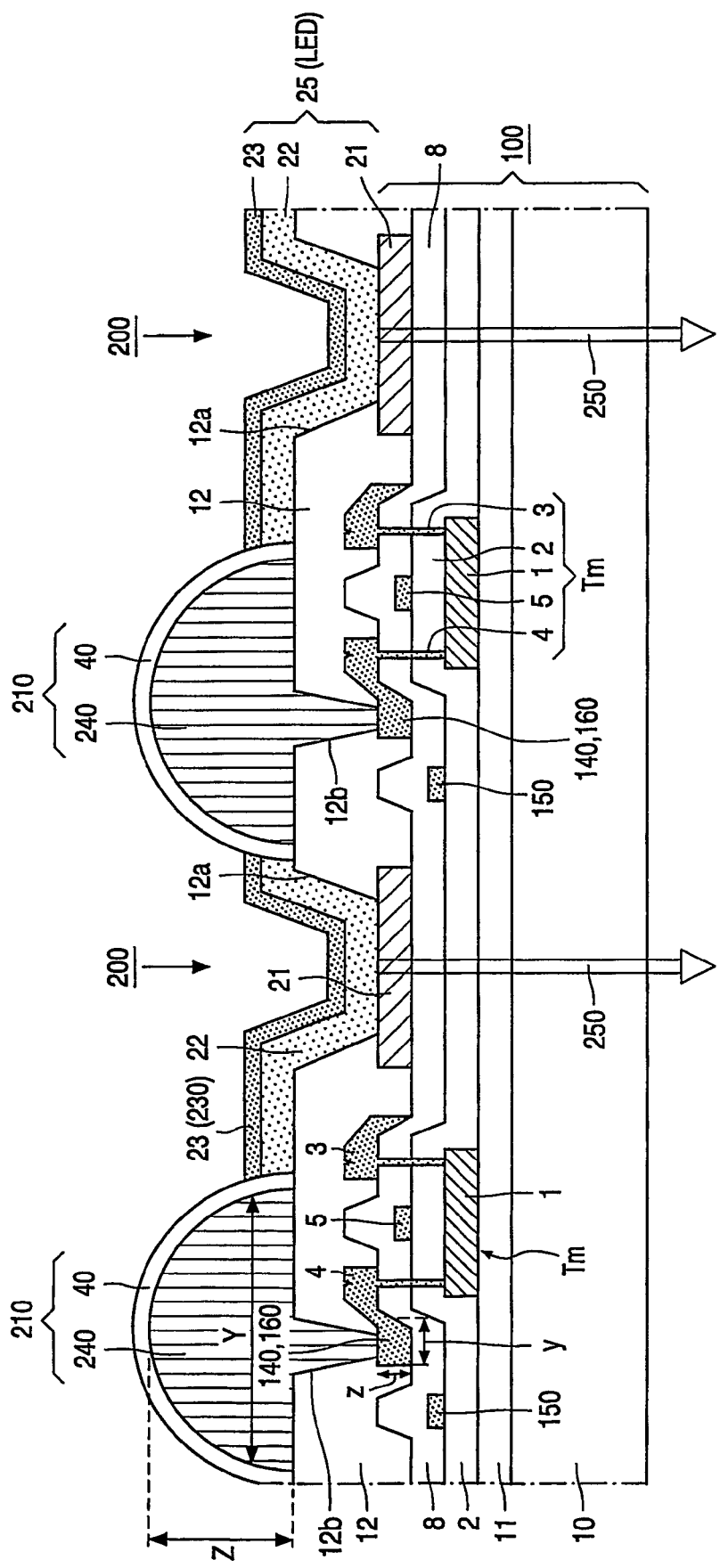
FIG. 2 is a cross-sectional view of part of the pixel array and circuit substrate of one embodiment of such a device, showing one example of a conductive barrier construction connected to a TFT source or drain line in accordance with the invention.
Figure 3:
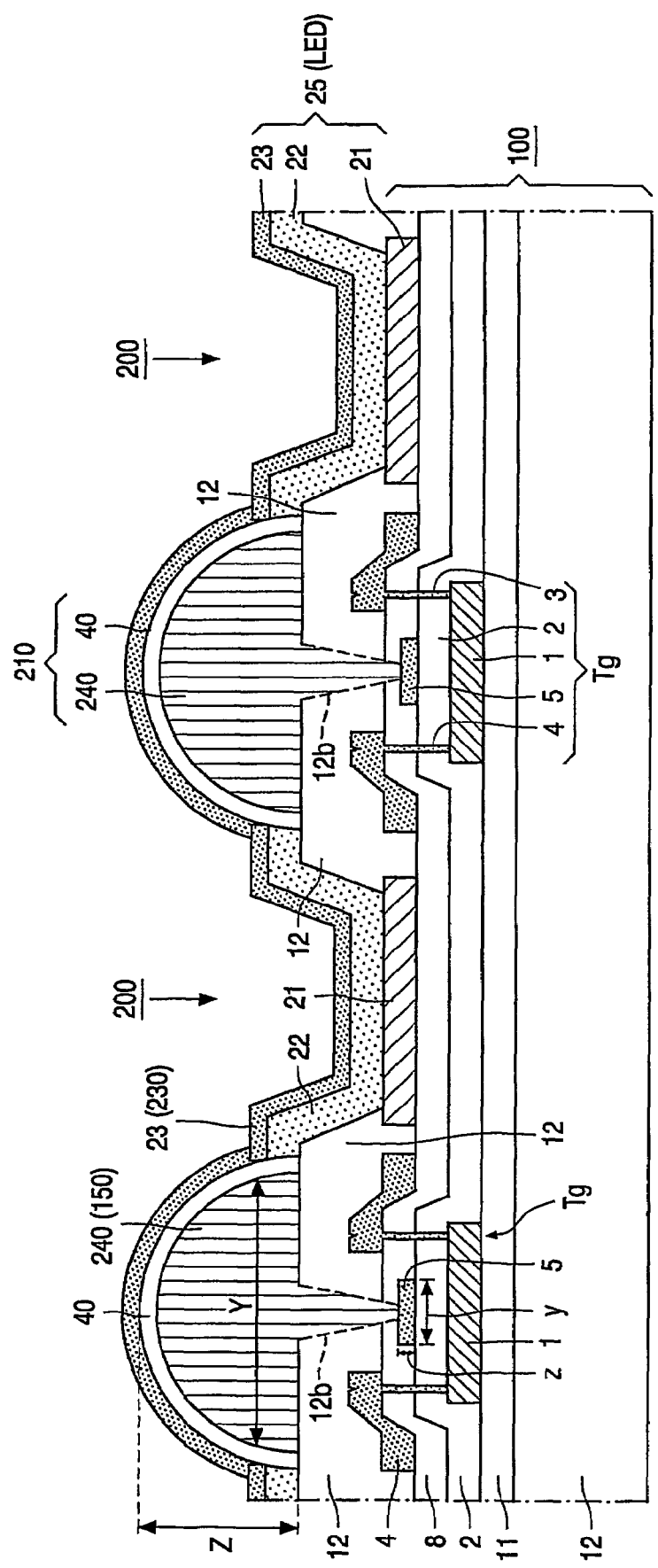
FIG. 3 is a cross-sectional view of part of the pixel array and circuit substrate of a similar embodiment of such a device, showing another example of a conductive barrier construction connected to a TFT gate line in accordance with the invention.
Figure 5:
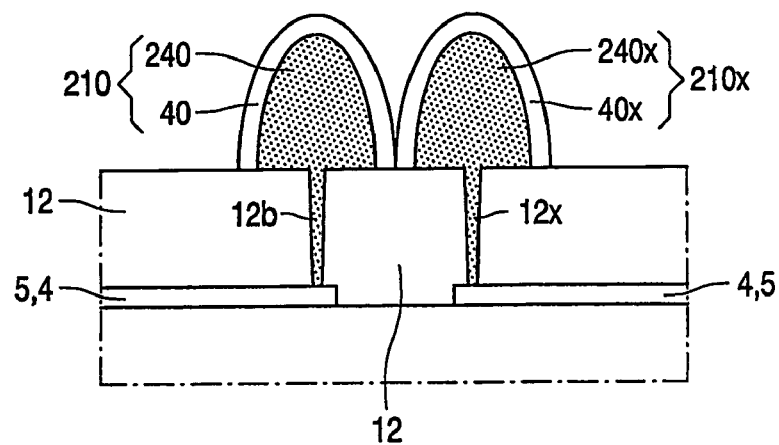
Figure 6:
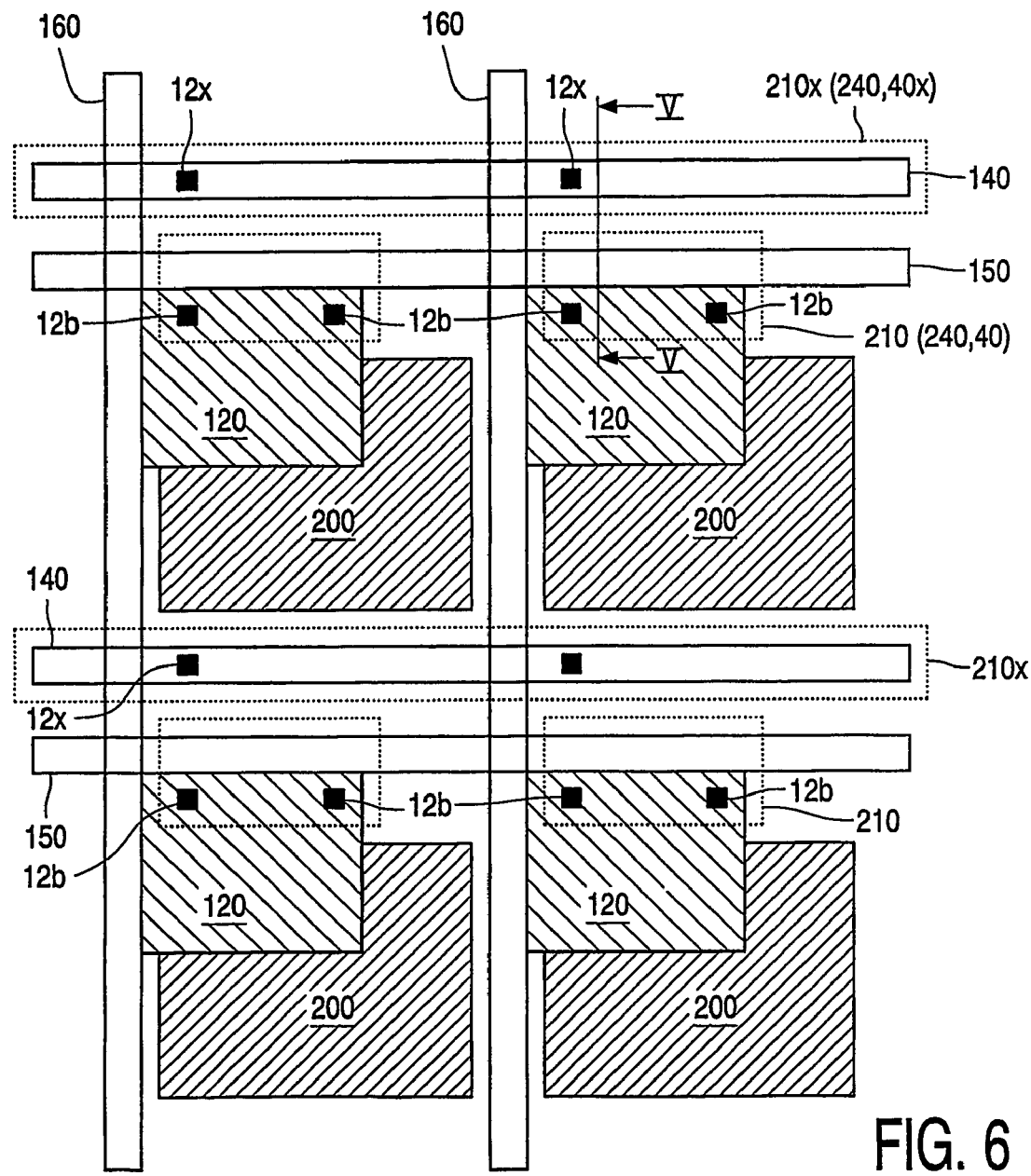
Figure 7:
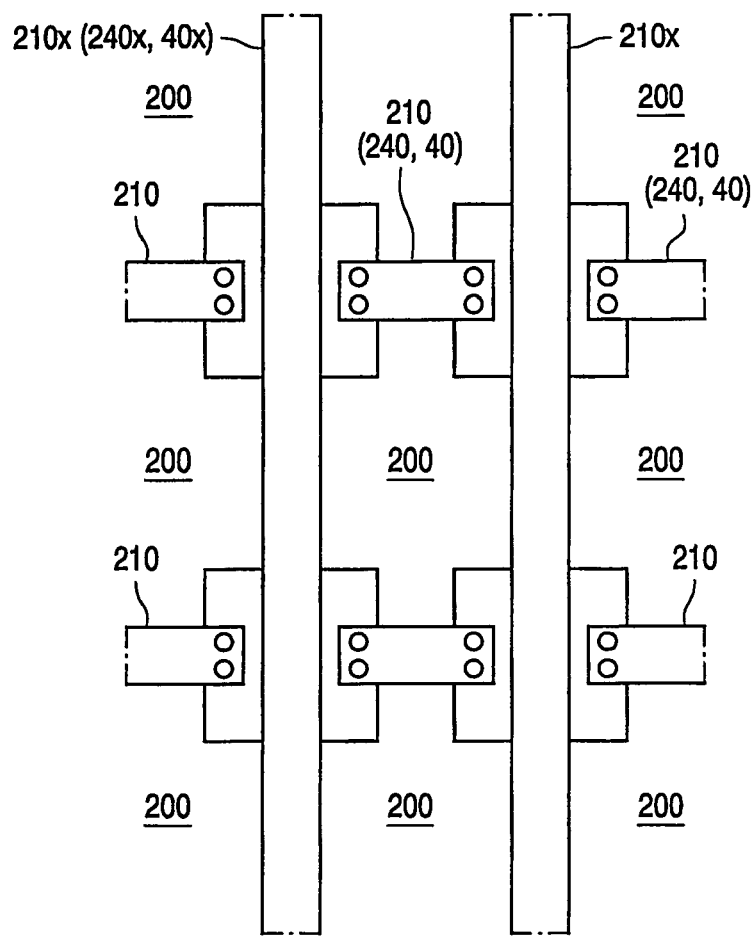
Figure 8:
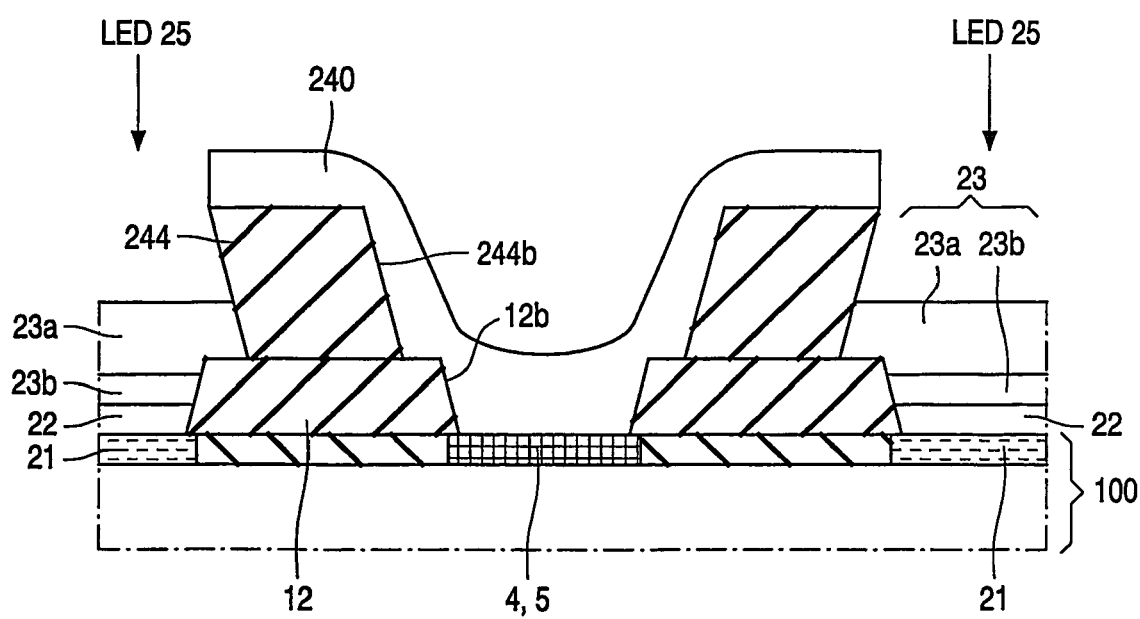
Figure 9:
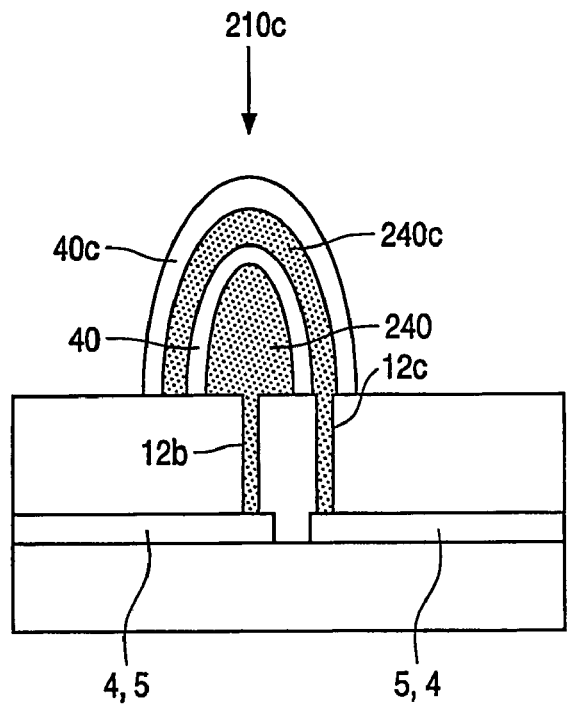
Figure 10:
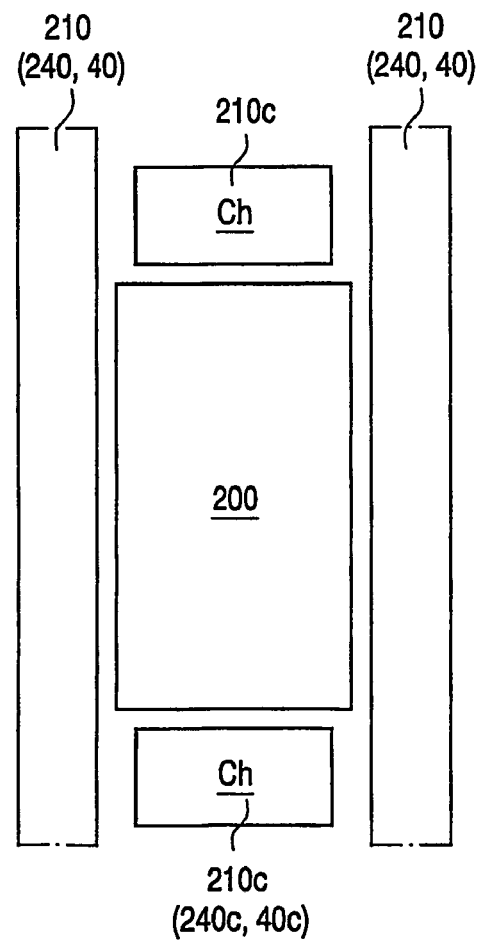
Figure 11:
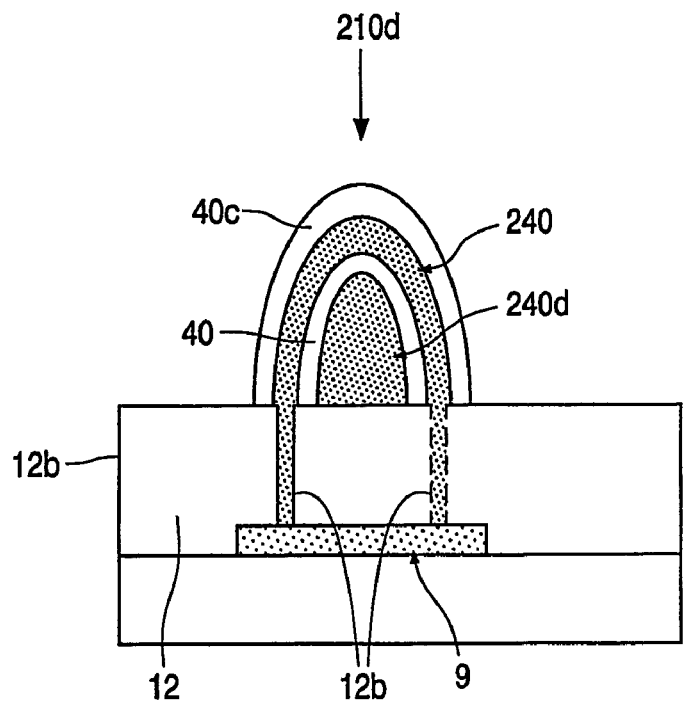
Figure 12:
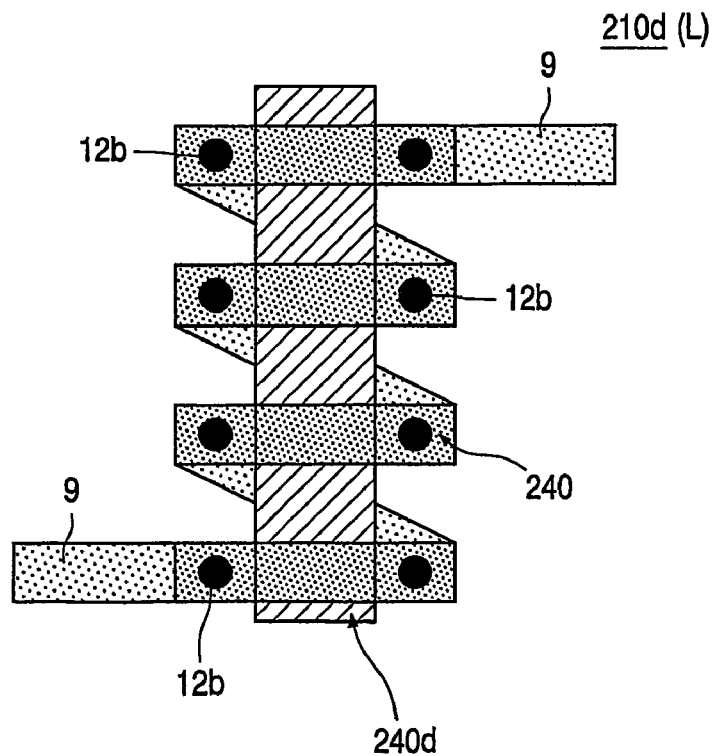
Figure 13:
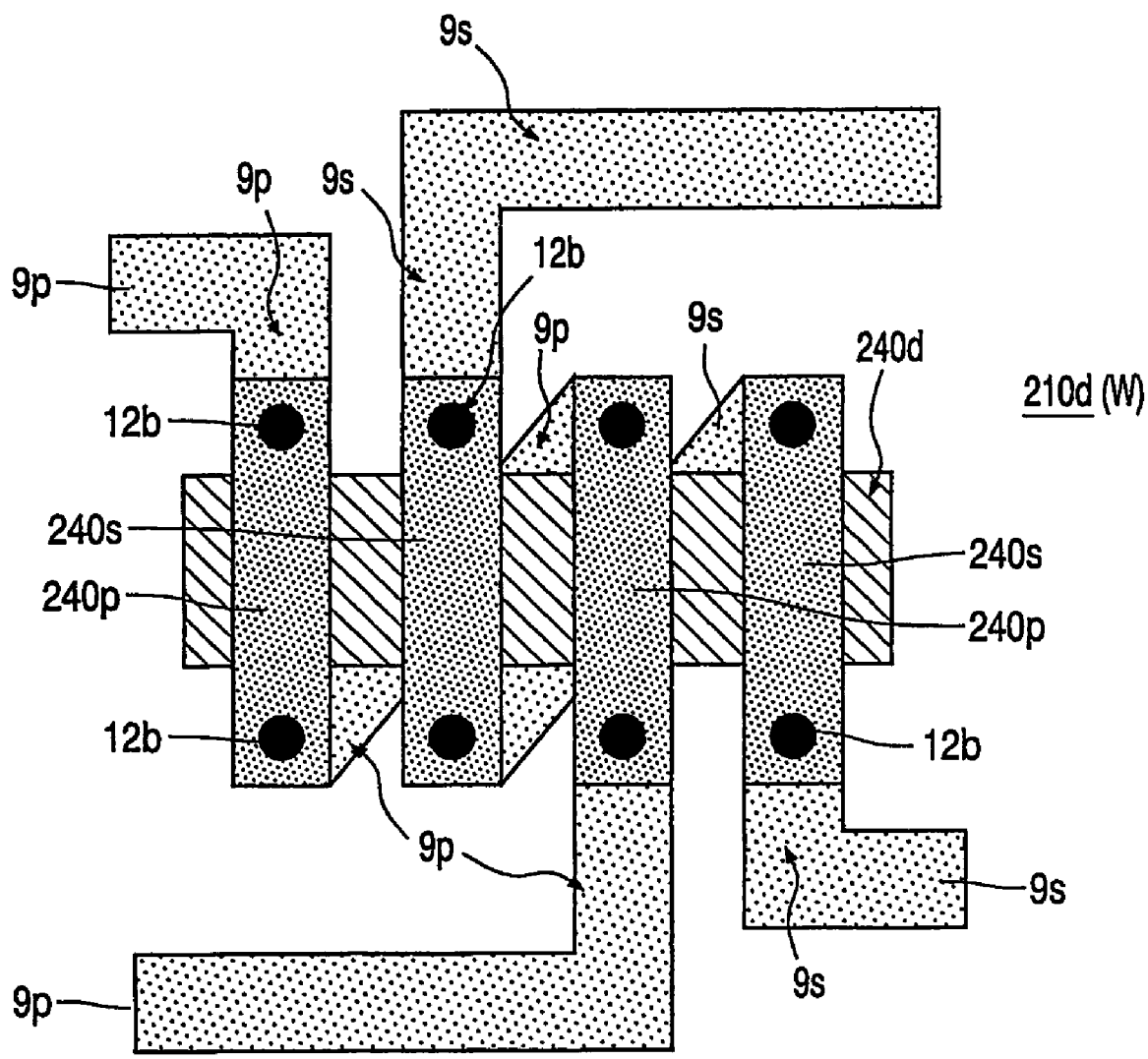
Figure 14:
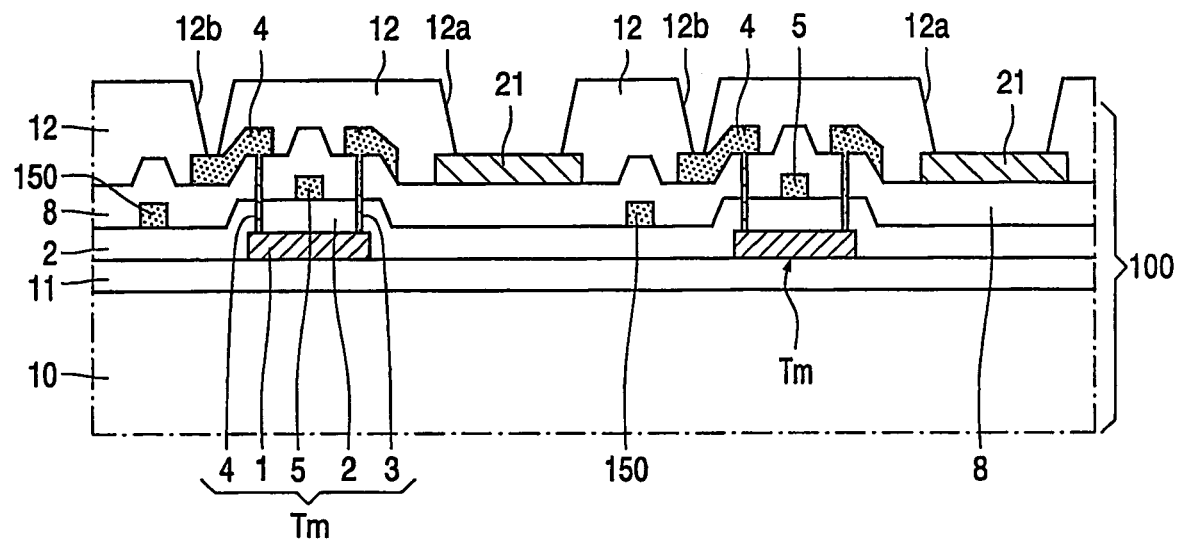
Figure 15:
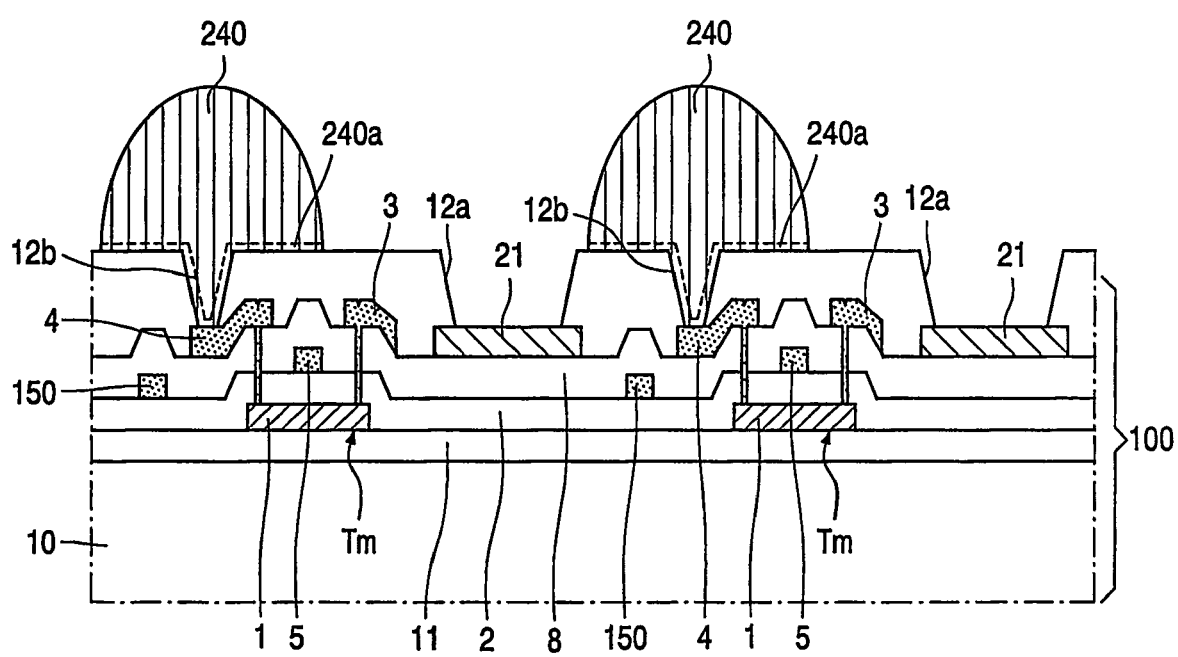
Figure 16:
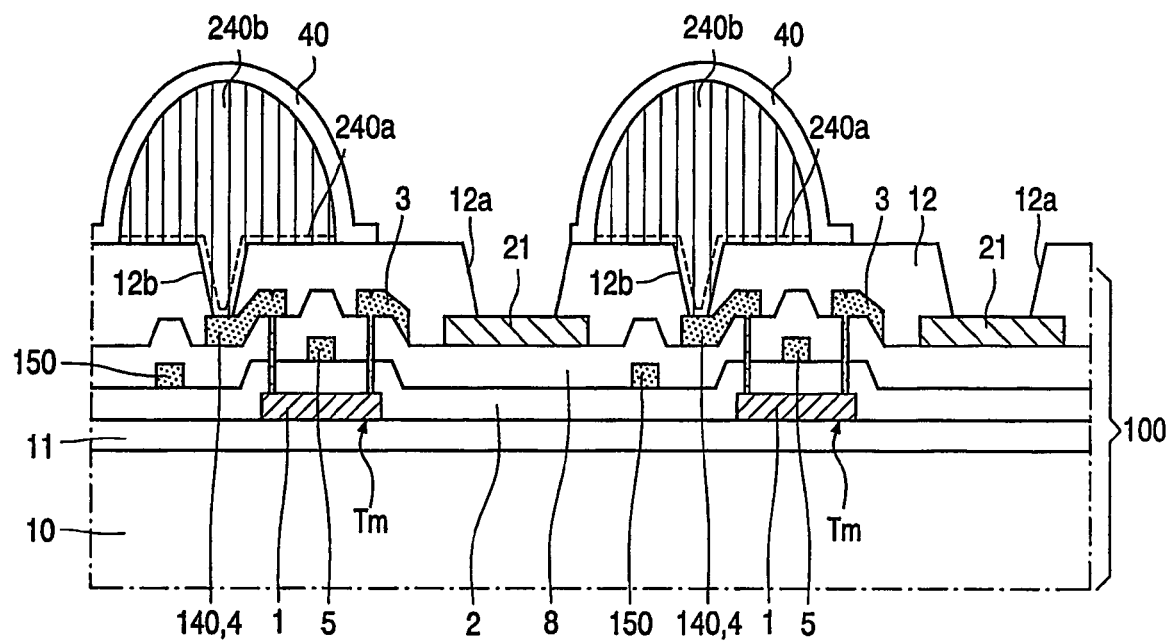
Figure 17:
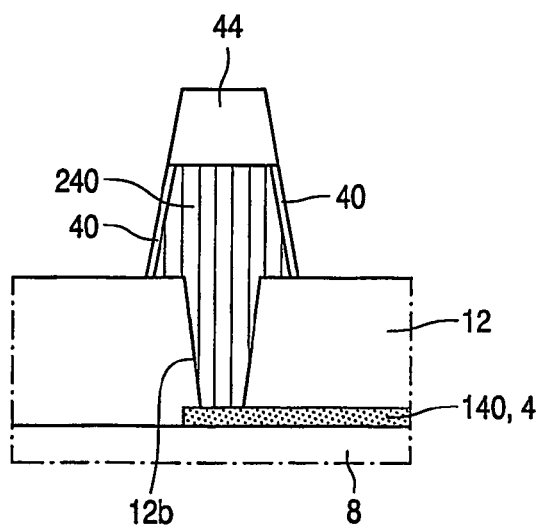

FIG. 5 is a cross-sectional view through side-by-side barriers, each with conductive barrier material for a particular embodiment of a device in accordance with the invention, FIG. 6 is a plan view of four pixel areas showing a specific example of layout features for a particular embodiment of a device in accordance with the invention, with side-by-side conductive barriers, for example, with the cross-sectional view of FIG. 5 taken on the line V-V of FIG. 6;

FIG. 7 is a plan view of another example of layout features for a particular embodiment of a device in accordance with the invention, with transverse conductive barriers;

FIG. 8 is a sectional view of a device part with yet another example of a conductive barrier construction using a metal coating in accordance with the invention;

FIG. 9 is a cross-sectional view of a conductive barrier construction that additionally includes a metal coating to form a capacitor embodiment in accordance with the invention;

FIG. 10 is a plan view of transverse barrier layout features suitable for a device having such a capacitor embodiment in accordance with the invention;

FIG. 11 is a cross-sectional view of a conductive barrier construction in an inductor embodiment in accordance with the invention;

FIG. 12 is a plan view of layout features suitable for such an inductor embodiment;

FIG. 13 is a plan view of layout features suitable for a transformer embodiment, having a cross-section similar to that of FIG. 12;

FIGS. 14 to 16 are sectional views of a device part such as that of FIG. 2 or FIG. 3 at stages in its manufacture with one particular embodiment in accordance with the invention; and FIG. 17 is a sectional view a device part at the FIG. 16 stage, illustrating a modification in the insulation of the conductive barrier material that is also in accordance with the present invention.

It should be noted that all the Figures are diagrammatic. Relative dimensions and proportions of parts of these Figures have been shown exaggerated or reduced in size, for the sake of clarity and convenience in the drawings. The same reference signs are generally used to refer to corresponding or similar features in modified and different embodiments.

Figure 1:
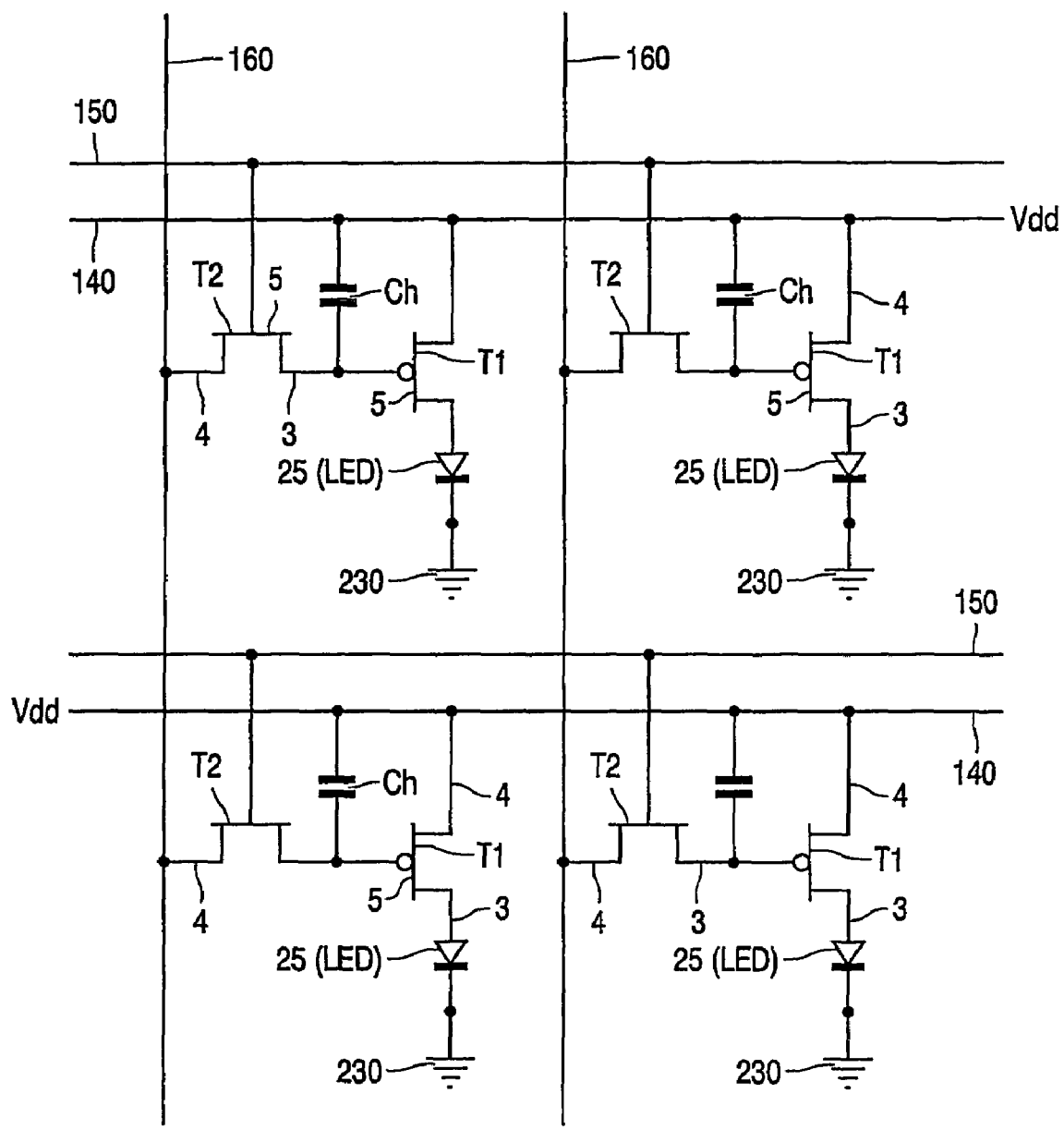
FIG. 1 is a circuit diagram for four pixel areas of an active-matrix electroluminescent display device which can be provided with conductive barrier material in accordance with the invention.

Embodiments of FIGS. 1 to 3

The active-matrix electroluminescent display (AMELD) device of each of the FIGS. 1 to 3 embodiments comprises an array of pixels 200 on a circuit substrate 100 with matrix addressing circuitry. Physical barriers 210 are present between at least some of the neighbouring pixels in at least one direction of the array. At least some of these barriers 210 are constructed with conductive barrier material 240 that is used as an interconnection in accordance with the present invention. Apart from this special construction and use of the barriers 210 in accordance with the present invention, the display may be constructed using known device technologies and circuit technologies, for example as in the background references cited hereinbefore.

The matrix addressing circuitry comprises transverse sets of addressing (row) and signal (column) lines 150 and 160, respectively, as illustrated in FIG. 1. An addressing element T2 (typically a thin-film transistor, hereafter termed "TFT") is incorporated at each interception of these lines 150 and 160. FIG. 1 depicts, by way of example, one specific pixel circuit configuration. Other pixel circuit configurations are known for active matrix display devices, and it should readily be understood that the present invention may be applied to the pixel barriers of such a device regardless of the specific pixel circuit configuration of the device.

Each pixel 200 comprises a current-driven electroluminescent display element 25 (21,22,23), typically a light-emitting diode (LED) of organic semiconductor material. The LED 25 is connected in series with a drive element T1 (typically a TFT) between two voltage supply lines 140 and 230 of the array. These two supply lines are typically a power supply line 140 (with voltage Vdd) and a ground line 230 (also termed "return line"). Light emission from the LED 25 is controlled by the current flow through the LED 25, as altered by its respective drive TFT T1.

Each row of pixels is addressed in turn in a frame period by means of a selection signal that is applied to the relevant row conductor 150 (and hence to the gate of the addressing TFTs T2 of the pixels of that row). This signal turns on the addressing TFT T2, so loading the pixels of that row with respective data signals from the column conductors 160. These data signals are applied to the gate of the individual drive TFT T1 of the respective pixel. In order to hold the resulting conductive state of the drive TFT T1, this data signal is maintained on its gate 5 by a holding capacitor Ch that is coupled between this gate 5 and the drive line 140,240. Thus, the drive current through the LED 25 of each pixel 200 is controlled by the driving TFT T1 based on a drive signal applied during the preceding address period and stored as a voltage on the associated capacitor Ch. In the specific example of FIG. 1, T1 is shown as a P-channel TFT, whereas T2 is shown as an N-channel TFT.

This circuitry can be constructed with known thin-film technology. The substrate 100 may have an insulating glass base 10 on which an insulating surface-buffer layer 11, for example, of silicon dioxide is deposited. The thin-film circuitry is built up on the layer 11 in known manner FIGS. 2 and 3 show TFT examples Tm and Tg, each comprising: an active semiconductor layer 1 (typically of polysilicon); a gate dielectric layer 2 (typically of silicon dioxide); a gate electrode 5 (typically of aluminium or polysilicon); and metal electrodes 3 and 4 (typically of aluminium) which contact doped source and drain regions of the semiconductor layer 1 through windows (vias) in the over-lying insulating layer(s) 2 and 8. Extensions of the electrodes 3, 4 and 5 may form, for example, interconnections between the elements T1, T2, Ch and LED 25, and/or at least part of the conductor lines 140, 150 and 160, depending on the circuit function provided by the particular TFT (for example, the drive element T1 or the addressing element T2 or another TFT of the circuit substrate). The holding capacitor Ch may be formed similarly, in known manner, as a thin-film structure inside the circuit substrate 100.

The LED 25 typically comprises a light-emitting organic semiconductor material 22 between a lower electrode 21 and an upper electrode 23. In a preferred particular embodiment, semiconducting conjugated polymers may be used for the electroluminescent material 22. For a LED that emits its light 250 through the substrate 100, the lower electrode 21 may be an anode of indium tin oxide (ITO), and the upper electrode 23 may be a cathode comprising, for example, calcium and aluminium. FIGS. 2 and 3 illustrate a LED construction in which the lower electrode 21 is formed as a thin film in the circuit substrate 100. The subsequently-deposited organic semiconductor material 22 contacts this thin-film electrode layer 21 at a window 12a in a planar insulating layer 12 (for example of silicon nitride) that extends over the thin-film structure of the substrate 100.

As in known devices, the devices of FIGS. 1 to 4 in accordance with the present invention include physical barriers 210, between at least some of the neighbouring pixels in at least one direction of the array. These barriers 210 may also be termed "walls", "partitions", "banks", "ribs", "separators", or "dams", for example. Depending on the particular device embodiment and its manufacture, they may be used in known manner, for example:

to separate and prevent overflow of a polymer solution between the respective areas of the individual pixels 200 and/or columns of pixels 200, during the provision of semiconducting polymer layers 22;

to provide a self-patterning ability on the substrate surface in the definition of the semiconducting polymer or other electroluminescent layers 22 for the individual pixels 200 and/or for columns of pixels 200 (and possibly even a self-separation of individual electrodes for the pixels, for example an individual bottom layer of the upper electrodes 23);

to act as a spacer for a mask over the substrate surface during the deposition of at least an organic semiconductor material 22 and/or electrode material;

to form opaque barriers 210 for a well-defined optical separation of the pixels 200 in the array, when light 250 is emitted through the top (instead of, or as well as, the bottom substrate 100).

Whatever their specific use in these known ways, at least some insulated lengths of the physical barriers 210 in embodiments of the present invention are constructed and used in a special manner. Thus, the pixel barriers 210 of FIGS. 2 to 4 comprise metal 240 (or other electrically-conductive material 240) that is insulated at their sides adjacent the LEDs 25 and that are connected to and/or from one or more circuit elements of the circuit substrate 100. This circuit element may take a variety of forms, depending on the particular improvement or enhancement or adaptation being made. Typically, it may be one or more thin-film elements of the group comprising: a conductor layer and/or an electrode connection 4, 5, 6; a supply line 140; an addressing line 150; a signal line 160; a thin-film transistor T1, T2, Tm, Tg; a thin-film capacitor Ch.

In the embodiment of FIG. 2, the circuit element connected to the conductive barrier material 240 is an extension of the source and/or drain electrode of TFT Tm. It may form a signal (column) line 160, for example, of the substrate circuitry when Tm is T2, or a drive line 140 when Tm is T1. In the embodiment of FIG. 3, the circuit element connected to the conductive barrier material 240 is an extension of the gate electrode 5 of TFT Tg. It may form an addressing (row) line 150, for example, of the substrate circuitry when Tg is T2.

Figure 4:
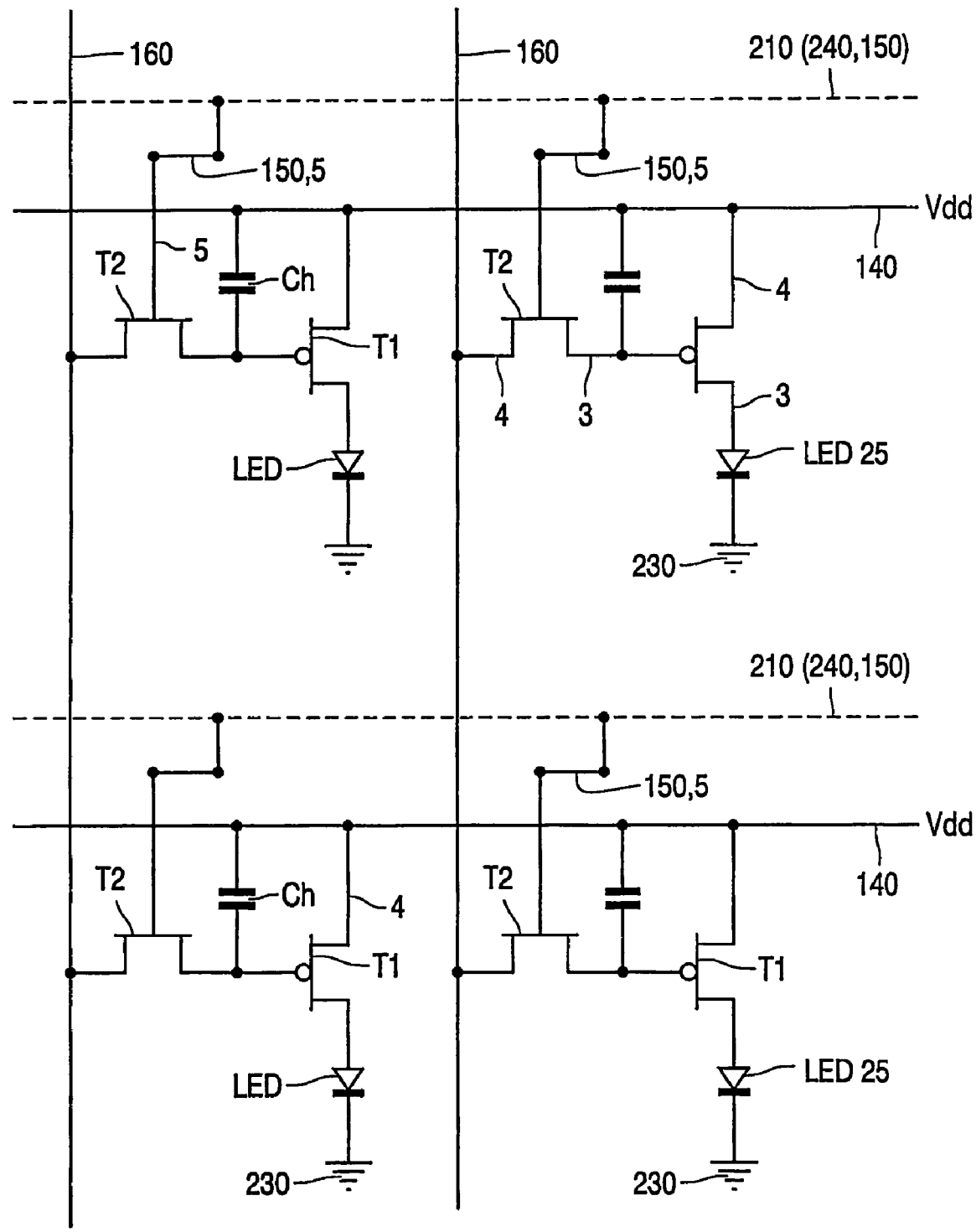
FIG. 4 is a circuit diagram, similar to that of FIG. 1, but showing the use of pixel barriers with conductive barrier material to replace most of the addressing lines.

The pixel barriers 210 in the embodiments of FIGS. 2 to 4 are predominantly of electrically-conductive material 240, 240x, preferably metal for very low resistivity (for example aluminium or copper or nickel or silver). The barriers 210 of FIGS. 2 and 3 comprise a bulk or core of the conductive material that has an insulating coating 40 on its sides and on its top.

As shown in FIGS. 2 and 3, the bottom connections of the conductive barrier material 240 to the circuit element 4,5 occur at connection windows 12b in the intermediate insulating layer 12. However, it should be understood that these windows 12b may often not be in the same plane as the TFT Tm, Tg. In particular, there is generally insufficient space between the source and drain electrodes 3 and 4 of TFT Tg to accommodate a window 12b. Thus, the window 12b is depicted in broken outline in FIG. 3 to indicate its location outside the plane of the drawing paper.

Addressing Line Barrier Embodiment of FIG. 4

The conductive barrier material 240 connected to a TFT gate line (as in FIG. 3, for example) may provide at least part of the addressing (row) lines 150. One such embodiment is illustrated in FIG. 4, wherein most of the line 150 is formed by the conductive barrier material 240.

Line resistance can be significantly reduced by using the conductive barrier material 240 to replace or to back up the conductor line 150 of the circuit substrate 10. Thus, along the line 240(150), the conductive barrier material 240 has a cross-sectional area that is at least twice (possibly even an order of magnitude) larger than that of the conductor layer that typically provides a gate line 5(150) of TFT Tg in the circuit substrate 100. Typically, the conductive barrier material 240 may have a thickness Z that is a factor of two or more (for example at least five times) larger than the thickness z of this conductor layer 5(150) in the circuit substrate 100. In a specific example Z may be between 2 μm and 5 μm as compared with 0.5 μm or less for z. Typically, the conductive barrier material 240 may have a line width Y that is the same width (or even at least twice as large) as the line width y of the conductor layer 140. In a specific example Y may be 20 μm as compared with 10 μm for y. Furthermore, the gate line 5(150) is typically of doped polysilicon, whereas the conductive barrier material 240 is typically metal having a much higher conductivity.

Multi-Conductor Barrier Embodiments of FIGS. 5 and 6

FIG. 5 illustrates a composite of two side-by-side barriers 210 and 210x, each comprising a metal core 240, 240x insulated with a respective coating 40, 40x. This side-by-side multi-conductor barrier structure 210,21x can be designed and used in a variety of ways. In one form, for example, the metal cores 240 and 240x may form (or back up) parallel addressing and supply lines 150 and 140 respectively. In another form, for example, one of the barriers 210 may be divided into insulated portions that provide an additional component, for example a capacitor as described below with reference to FIGS. 9 and 10. FIG. 6 gives one example of a suitable pixel layout, in which the matrix thin-film circuit area of the substrate 100 is designated as 120.

Modified Multi-Conductor Barrier Layout Embodiment of FIG. 7

In the modified layout of FIG. 7, the two barriers 210 and 210x (each comprising a metal core 240, 240x insulated with a respective coating 40, 40x) are arranged transverse to each other. In this case, barrier 210x (with connections to substrate TFT Tm as T2) may be used to back up or replace the column lines 160. The barrier 210 (with connections to substrate TFT Tg as T2) may be used to back up or replace the row lines 150. Alternatively, the. barrier 210 (with connections to substrate TFT Tm as T1) may be used to back up or replace the supply lines 140.

Alternative Conductive Barrier Embodiment of FIG. 8

In the embodiments of FIGS. 2, 3, and FIG. 5, barriers 210 and 210x are shown as being predominantly of conductive material 240 and 240x. FIG. 8 shows a modified embodiment wherein the barrier 210 is predominantly of insulating material 244. In this case, vias 244b are etched or milled through the insulating material 244 to the circuit element 4, 5 in the circuit substrate 100. A metal coating 240 provides the conductive barrier material that extends on top of the insulating barrier 210 and in the vias 244b therethrough. This alternative conductive barrier construction is particularly suitable for embodiments in which the conductive barrier material 240 backs up or replaces thin-film conductor lines (such as lines 140, 150 and 160) of the circuit substrate 100.

The metal coating 240 of this barrier 210 may be formed simultaneously with a main part 23a of the upper electrode 23 of the LED 25, in a self-aligned manner. Thus, a layer of metal may be deposited simultaneously for the metal coating 240 and electrode 23 which are separated by a shadow-masking effect of an overhang shape in the side of the barrier 210, as illustrated in FIG. 12. This is one possible process embodiment for forming barrier interconnects 210, 240 in accordance with the present invention. FIGS. 15 to 17 illustrate other process embodiments for barrier interconnects 210, 240 that are predominantly of metal.

Capacitor and other Multi-Conductor Barrier Embodiments of FIGS. 9 and 10

The FIG. 9 embodiment is similar to those of FIGS. 2, 3, and 5, in having insulated lengths of the barrier 210 that comprise a metal core 240 as the main conductive barrier material. This metal core 240 is connected with the circuit element 4 or 5 etc. in the substrate 100 and has an insulating coating 40 on thereon.

However the embodiment of FIG. 9 additionally comprises a metal coating 240c that is present on the insulating coating 40, over the top and sides of the core 240. This metal coating 240c is connected to another circuit element of, for example, the substrate 100 such as element 5,4, etc. of another TFT.

This structure of FIG. 9 is more versatile than that of FIGS. 2, 3 and 5. It permits the metal core 240 and metal coating 240c to be used for different purposes, for example, to back-up or even replace the lines 140, 150 or 160, so reducing their line resistance. The metal coating 240c may serve as a co-axial shield for the signal on the core line 240. Alternatively, the metal coating 240c may be localised to specific locations along the barrier 210 where particular connections or components are required, for example at individual pixels or sub-pixels.

Instead of shielding, this multi-conductor structure 240, 240c for the barrier 210c might be used to overlap two lines; for example, a back-up or replacement barrier line 140 (including core 240) with a back-up or replacement barrier line 150 (including coating 240c). In this case, however, the thickness and dielectric properties of the insulating coating 40 need to be chosen to reduce parasitic capacitance and coupling between these lines 140 and 150.

Of particular importance is an embodiment in which the multi-conductor structure 240, 240c of FIG. 9 is designed to form a capacitor C with a capacitor dielectric 40. Thus, separate and/or insulated lengths of the metal core 240, insulating coating 40 and metal coating 240c may together form a capacitor C connected between the substrate circuit elements 4, 5, etc.

Such a capacitor may be, for example, the individual holding capacitor Ch for each respective pixel 200 which is connected between the supply line 140 (main electrode line 4 of TFT T1, Tm) and the gate line 5 of TFT T2, Tg (and main electrode line 3 of TFT T1, Tm). FIG. 10 illustrates a suitable pixel layout with this holding capacitor barrier 210c, Ch.

Inductor and other Multi-Metal Barrier Embodiments of FIGS. 11 to 13

FIGS. 11 to 13 illustrate barrier embodiments 210d with a metal core 240m that is not electrically connected to a circuit element of the device. In this case the conductive barrier material 240 connected to the thin-film substrate circuit element is the metal coating on the insulating coating 40 on the metal core 240d. Such a structure is useful for providing the display with an inductor or transformer having a ferromagnetic core 240d of, for example, nickel.

FIG. 12 illustrates an inductor embodiment, whereas FIG. 13 illustrates a transformer embodiment. In each case, the layout pattern of the metal coating 240 and the thin-film substrate metal tracks 9 are chosen (in relation to their connecting vias 12b) to form a winding conductor around the ferromagnetic core 240d. Both this coating 240 and the tracks 9 are of the non-ferromagnetic material (for example, aluminium). The coating 240 and tracks 9 form a single coil in the inductor L (FIG. 12). In the transformer W (FIG. 13), the coating 240 and tracks 9 form both a primary coil (240p, 9p) and a secondary coil (240s, 9s).

These components L and/or W can be used in various ways. They can facilitate power saving, especially in displays of very large area. Their integration with pixel barrier technology can be used to enhance device performance (for example, higher Q value) at low cost and within compact areas of the display device. A reduction in size may be achievable for equipment that comprises such a display device in accordance with the invention, as compared with adding the component outside of the display device.

Process Embodiment of FIGS. 14 to 16

Apart from constructing and using its barriers 210 with conductive material 240, the active-matrix electroluminescent display of a device in accordance with the present invention may be constructed using known device technologies and circuit technologies, for example as in the cited background references.

FIGS. 14 to 16 illustrate novel process steps in a particular manufacturing embodiment. The thin-film circuit substrate 100 with its upper planar insulating layer 12 (for example, of silicon nitride) is manufactured in known manner. Connection windows (such as vias 12a, 12b, 12x etc.) are opened in the layer 12 in known manner, for example by photolithographic masking and etching. However, in order to manufacture a device in accordance with the present invention, the pattern of these vias include the vias 12b, 12x that expose elements 4, 5, etc. for bottom connection with the conductive barrier material 240, 240x, 240c. The resulting structure is illustrated in FIG. 13. This stage is common regardless of whether the barriers 210 have a metal core as in FIGS. 2, 3, 5, 9, and 11 or are predominantly of insulating material as in FIG. 8.

The formation of barriers 210 predominantly of insulating material has been described above with reference to FIG. 8. Suitable process steps for barriers 210 with a metal core will now be described with reference to FIGS. 15 and 16.

In this case, electrically-conductive material for the barriers 210 is deposited on the insulating layer 12 at least in its vias 12a, 12b, 12x etc. The desired lengths and layout pattern for the barriers 210 is obtained using known masking techniques. FIG. 15 illustrates an embodiment in which at least the bulk 240 of the conductive barrier material (for example, copper or nickel or silver) is deposited by plating. In this case, a thin seed layer 240a of, for example, copper or nickel or silver is first deposited over the insulating layer 12 and its vias 12a, 12b, 12x etc, the barrier layout pattern is defined with a photolithographic mask, and then the bulk 240 of the conductive barrier material is plated to the desired thickness. The resulting structure is illustrated in FIG. 15.

Then, using CVD (chemical vapour deposition), insulating material (for example silicon dioxide or silicon nitride) is deposited for the insulating coating 40. The deposited material is left on the sides and top of the conductive barrier material by patterning using known photolithographic masking and etching techniques, as illustrated in FIG. 16.

Thereafter the manufacture is continued in known manner. Thus, for example, conjugate polymer materials 22 may be ink-jet printed or spin-coated for the pixels 200. The barriers 240,40 with their insulating coating 40 can be used in known manner to prevent polymer overflow from the pixel areas in between the physical barriers 240,40. The upper electrode material 23 is then deposited.

Modified Process Embodiment of FIG. 17

This embodiment uses an anodisation treatment (instead of deposition) to provide the insulating coating 40 at least at the sides of the barriers 210 adjacent to the pixel areas. Typically, the conductive barrier material 240 may comprise aluminium. The desired lengths and layout pattern of the deposited aluminium can be defined using known photolithographic masking and etching techniques. FIG. 17 shows the photolithically-defined etchant-mask 44 retained on the top of the aluminium barrier pattern 240.

Then, an anodic insulating coating of aluminium oxide is formed on at least the sides of the aluminium barrier material 240 using known anodisation techniques. Thus, no extra mask is needed to define the layout for this coating 40.

As illustrated in FIG. 17, the mask 44 can be retained during this anodisation, in areas where it is desired to protect and form an un-insulated top connection area 240t. In these areas, the anodic coating is formed at only the sides of the aluminium barrier pattern 240. The mask 44 may be removed before this anodisation, from areas where the anodic coating is required at both the sides and top of the aluminium barrier pattern 240. Alternatively, the mask 44 of an insulating polymer or, for example, silicon dioxide or nitride may be retained in these areas where insulation is desired over the top of the barrier 210(240,40) in the manufactured device.

Further Embodiments

In the embodiments described so far, the conductive barrier material 240 is a thick opaque metal, for example, aluminium, copper, nickel or silver. However, other conductive materials 240 may be used, for example a metal silicide or (less advantageously) a degenerately-doped polysilicon both of which may be surface-oxidised to form the insulating coating 40. If transparent barriers 210 are required, then ITO may be used for the conductive barrier material 240.

In addition to the components already described, barriers 210 with conductive material 240 may be used to form other components connected to the substrate circuitry. Thus, for example, aerials may be constructed at the periphery of the display, with coils 9,240 or with long straight lines of conductive barrier material 240. Such aerials are useful in, for example, a mobile phone having an active-matrix display in accordance with the invention.

The specific embodiments disclosed above are active-matrix electroluminescent display devices and the inventive use of the physical barriers 210 present in such devices between neighbouring pixels. However, similar principles may be applied to other active-matrix display devices such as, for example, AMLCDs (active-matrix liquid-crystal displays), which also comprise a circuit substrate 100' on which an array of pixels 200' is present and connected thereto.

In the AMLCD case, upstanding spacers 210' are present on the circuit substrate 100' between at least some of the neighbouring pixels 200'. The spacers 210' serve to support an overlying opposite plate of the display over the active-matrix circuit substrate 100'. They define thereby the cell spacing in which the liquid crystal material is accommodated. As regards their layout configuration, these AMLCD spacers 210' may be localised pillars between pixels, or they may be short walls with some longitudinal extension between pixels.

In a modification in accordance with the present invention, these upstanding spacers 210' of an AMLCD may be constructed with conductive material 240 similar to the physical barriers 210 disclosed above for AMELDs and may be similarly connected. Thus, the AMLCD may include novel spacers 210' that are formed partly (or even predominantly) of metal or another conductive material 240, while being insulated at least at their sides adjacent to the liquid-crystal pixel cells, and provide connections into and/or out of the circuit substrate 100' of the AMLCD to locally back-up or locally replace lengths of a substrate conductor line (e.g. 150',

160') and/or to form additional components (e.g. C, L, W) connected into the AMLCD.

The additional components (for example, capacitors, inductors, transformers and/or aerials) can be constructed with combinations of conductive spacer material 240 and insulating spacer material 40 (and/or 244) that are provided locally on the circuit substrate 100' of the AMLCD, in a manner similar to that described above for composite barrier elements 210 in AMELD devices. They can be similarly connected with circuit elements (4', 5', 6', 150', 160', T1', T2', etc.) of the AMLCD circuit substrate 100', at windows 12b in an intermediate insulating layer 12 on the circuit substrate 100'.

Thus, the composite spacer elements 210' of an AMLCD in accordance with the invention can be constructed and connected in a manner similar to that of, for example, any one of the barrier elements 210 of FIGS. 3, 5, 7 to 13, 16 or 17.

From reading the present disclosure, other variations and modifications will be apparent to persons skilled in the art. Such variations and modifications may involve equivalent and other features which are already known in the art (for example in the cited background references) and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to any such features and/or combinations of such features during the prosecution of the present Application or of any further Application derived therefrom.

Thus, for example, the present Application discloses a novel use of conductive material in a pixel barrier on a circuit substrate of an active-matrix display device, so as to connect with circuitry in the circuit substrate of the device and to provide a back-up arid/or a replacement and/or an additional component that is integrated in the device.

According to one aspect, important novelty resides in such use of conductive barrier material in the pixel barrier construction of an electroluminescent display, and particularly in the type of barriers used between light-emitting diodes of organic semiconductor material. Thus, the present Application discloses what are generally novel features of an active-matrix electroluminescent display device (and its manufacture), comprising: a circuit substrate on which an array of pixels is present with physical barriers between at least some of the neighbouring pixels in at least one direction of the array; each pixel comprising an electroluminescent element (for example, a current-driven light-emitting diode of organic semiconductor material); the circuit substrate comprising circuitry to which the electroluminescent elements are connected (for example, matrix addressing and drive circuitry for the array, preferably with thin-film circuit elements); and the physical barriers comprising one or more parts of metal and/or of conductive material that is connected with a circuit element in the circuit substrate (for example, with a thin-film conductor layer and/or electrode connection and/or supply line and/or addressing line and/or signal (column) line and/or a thin-film transistor and/or a thin-film capacitor) via connection windows that are present (for example, in an intermediate insulating layer) on the circuit substrate (for example, under the conductive barrier material).

According to another aspect, important novelty resides in the use of multiple parts of metal and/or conductive material in the construction of pixel barriers of an active-matrix display device (whether an AMELD or an AMLCD) so as to provide additional components integrated in the device. Thus, one or more mutually insulated lengths (or other parts) of the pixel barrier layout may comprise a metal-insulator coated barrier structure that provides a capacitor or (with a ferromagnetic core) an inductor, transformer or aerial. These novel barrier structures may be localised to, for example, individual pixels or groups of pixels and/or to other device areas. Thus, the additional component may be formed inside or outside the pixel array, but still formed on the circuit substrate in the same process steps as the pixel barriers. The component-forming barrier length typically comprises one or more coatings of metal, conductive and insulating materials and may have a conductive and/or metal core to the barrier. Where the component-forming barrier length is located between pixels, it can be insulated (for example, with an insulating layer/coating) at least at the sides of the barriers adjacent to the display element.

The invention claimed is:

1. An active-matrix display device comprising: a circuit substrate on which an array of pixels is present with physical barriers between at least some of the neighbouring pixels in at least one direction of the array; each pixel comprising a display element; the circuit substrate comprising circuitry to which the display elements are connected; the physical barriers comprising conductive material that is connected with a circuit element in the circuit substrate via contact windows in an intermediate insulating layer on the circuit substrate; and the conductive barrier material being insulated at least at the sides of the barriers adjacent to the display elements.

2. A device according to claim 1, wherein the said circuit element in the circuit substrate is at least one thin-film element of a group comprising: a conductor layer; an electrode connection; a supply line; an addressing line; a signal line; a thin-film transistor; a thin-film capacitor.

3. A device according to claim 1, wherein at least insulated lengths of the barrier comprise a metal core that provides the conductive barrier material, which metal core is connected with the circuit element in the circuit substrate and has an insulating coating on at least its sides.

4. A device according to claim 3, wherein a metal coating is present on the insulating coating on the metal core and is connected to another circuit element.

5. A device according to claim 4, wherein the metal core, insulating coating and metal coating together form a capacitor, for example an individual holding capacitor for each respective pixel.

6. A device according to claim 1, wherein at least an insulated length of the barrier comprises a metal coating on an insulating coating on a metal core of at least that length of the barrier, and the metal coating provides the conductive barrier material that is connected with the circuit element in the substrate.

7. A device according to claim 6, wherein the metal core is of nickel or another ferromagnetic material, and the metal coating is of non-ferromagnetic material that is connected with a conductor track of non-ferromagnetic material in the substrate to form at least one coil of an inductor or transformer that comprises the ferromagnetic metal core.

8. A device according to claim 1, wherein at least insulated lengths of the barriers are predominantly of the conductive barrier material (and preferably comprising metal).

9. A device according to claim 1, wherein the physical barrier is predominantly of insulating material through which vias extend for connection with the circuit element in the circuit substrate, and wherein a metal coating that provides the conductive barrier material extends on top of the physical barrier and in the vias through the physical barrier.

10. A device according to claim 1, wherein the circuit substrate comprises matrix addressing circuitry that is connected with transverse addressing and signal lines, and the conductive barrier material provides at least part of the addressing lines.

11. A device according to claim 1, wherein the conductive barrier material serves as an interconnection between the said circuit element in the circuit substrate and a further circuit element of the device.

12. A device according to claim 1, wherein the barriers are present between electroluminescent display elements that comprise a light-emitting diode of organic semiconductor material.

13. A device according to claim 1, wherein the barriers are spacers in an active-matrix liquid-crystal display.

* * * * *